(12) United States Patent
Deng et al.

(10) Patent No.: US 10,032,824 B2
(45) Date of Patent: Jul. 24, 2018

(54) IMAGE SENSOR STRUCTURE AND PACKAGING METHOD THEREOF

(71) Applicant: GALAXYCORE SHANGHAI LIMITED CORPORATION, Shanghai (CN)

(72) Inventors: Hui Deng, Shanghai (CN); Lixin Zhao, Shanghai (CN)

(73) Assignee: GALAXYCORE SHANGHAI LIMITED CORPORATION, Shanghai (CN)

(*) Notice: Subject to any disclaimer, the term of this patent is extended or adjusted under 35 U.S.C. 154(b) by 0 days.

(21) Appl. No.: 15/312,628

(22) PCT Filed: May 4, 2015

(86) PCT No.: PCT/CN2015/078185
§ 371 (c)(1),
(2) Date: Nov. 19, 2016

(87) PCT Pub. No.: WO2015/176601
PCT Pub. Date: Nov. 26, 2015

(65) Prior Publication Data
US 2017/0092689 A1   Mar. 30, 2017

(30) Foreign Application Priority Data

May 20, 2014   (CN) .......................... 2014 1 0217743

(51) Int. Cl.
*H01L 31/18* (2006.01)
*H01L 27/146* (2006.01)
(Continued)

(52) U.S. Cl.
CPC ........ *H01L 27/14687* (2013.01); *H01L 24/45* (2013.01); *H01L 27/1462* (2013.01);
(Continued)

(58) Field of Classification Search
CPC . H01L 2924/00014; H01L 2224/48091; H01L 27/14618; H01L 2924/00;
(Continued)

(56) References Cited

U.S. PATENT DOCUMENTS 8,466,531 B2   6/2013   Seo et al.
8,947,591 B2   2/2015   Yoshida et al.
(Continued)

FOREIGN PATENT DOCUMENTS

CN   1661805 A   8/2005
CN   101055883 A   8/2005
(Continued)

OTHER PUBLICATIONS

PCT Search Report, dated Aug. 14, 2015.

*Primary Examiner* — Jaehwan Oh
(74) *Attorney, Agent, or Firm* — Dority & Manning, P.A.

(57) ABSTRACT

The present invention discloses a CMOS image sensor structure and packaging method thereof. The method includes the following steps: providing an image sensor chip and a transparent package substrate that is ground and cut, the front side of the image sensor chip being provided with an image sensing region and a pad region surrounding the image sensing region; bonding a first end of a metal wire onto the pad, the other end being suspended outside the image sensor chip; bonding the transparent package substrate and the image sensor chip having the metal wire to form an image sensor package, which can be assembled by surface mount technology (SMT) or pressure welding via the exposed and suspended metal wire. In the present invention, an auxiliary substrate is optionally used and an optical glass is directly fixed to the image sensor chip, and the image sensor chip is directly connected to a circuit board. The image sensor products using this packaging (Continued)

method have better performance, reliability, and ultra-low packaging costs.

18 Claims, 6 Drawing Sheets

(51) Int. Cl.
    *H01L 23/00*     (2006.01)
    *G02B 5/20*     (2006.01)
    *G02B 1/11*     (2015.01)

(52) U.S. Cl.
    CPC .. *H01L 27/14618* (2013.01); *H01L 27/14632* (2013.01); *H01L 27/14649* (2013.01); *H01L 27/14685* (2013.01); *G02B 1/11* (2013.01); *G02B 5/208* (2013.01); *H01L 2224/45124* (2013.01); *H01L 2224/45139* (2013.01); *H01L 2224/45144* (2013.01); *H01L 2224/45147* (2013.01)

(58) Field of Classification Search
    CPC . H01L 2224/32225; H01L 2224/48227; H01L 2924/181
    See application file for complete search history.

(56) References Cited

U.S. PATENT DOCUMENTS

| 9,025,079 | B2 | 5/2015 | Kamada | |
| 2003/0090877 | A1* | 5/2003 | Ochiai | H01L 21/565 361/723 |
| 2004/0046245 | A1* | 3/2004 | Minervini | B81B 7/0064 257/704 |
| 2005/0237415 | A1 | 10/2005 | Kong et al. | |
| 2006/0098244 | A1 | 5/2006 | Choi et al. | |
| 2007/0108577 | A1 | 5/2007 | Tu et al. | |
| 2008/0309805 | A1 | 12/2008 | Chan | |
| 2009/0294978 | A1* | 12/2009 | Ota | H01L 21/563 257/773 |
| 2012/0257075 | A1* | 10/2012 | Kamada | H01L 27/14618 348/222.1 |
| 2013/0193545 | A1* | 8/2013 | Jeong | H01L 31/0236 257/433 |
| 2013/0264703 | A1 | 10/2013 | Tae et al. | |
| 2014/0264699 | A1* | 9/2014 | Ryu | H01L 27/14618 257/434 |

FOREIGN PATENT DOCUMENTS

| CN | 103560138 A | 2/2014 |
| KR | 20130094965 A | 8/2013 |

\* cited by examiner

Fig. 2i ered poorly; 3.

IMAGE SENSOR STRUCTURE AND PACKAGING METHOD THEREOF

FIELD

The present invention relates to the field of semiconductor manufacturing, and more particularly to a method of packaging CMOS image sensor.

BACKGROUND

Currently, known methods of packaging image sensors (CMOS Image Sensors, CISs) include Chip Scale Package (CSP), Chip On Board (COB), and Flip Chip (FC).

CIS CSP is a wafer level packaging technique widely used in medium-end and low-end, low-resolution (2M pixels or less) image sensors at present. This packaging technique bonds a wafer level glass to a wafer and separates the image sensor chips in the wafer from each other by cofferdam, and then manufactures Ball Grid Array (BGA) after arranging wiring on the back side of the wafer in pad region of ground wafer by manufacturing pad surface or metal connected through silicon via (TSV) technique surrounding the inner side of the holes in pad or T shape metal contacted chip level packaging technique at the side of pad after dicing, and then individually sealed cavity image sensor unit is formed after dicing. Module assembled structure is formed by SMT method during back-end. However, there are the following significant issues with CSP packaging: 1. influence on product performance: thick supporting glass has a great influence on light absorption, refraction, reflection, and diffraction for image sensors, especially on products with small size pixels; 2. reliability: during subsequent SMT processes and environmental changes during operation of the products, thermal expansion coefficient differences between different components of the package structure and gas sealed in the cavity result in reliability issues; 3. massive investment, large pollution control requirement, long production cycle, highly cost per chip particularly for high resolution, large size image sensor product.

CIS COB is a chip level packaging technique currently used generally in high end, high resolution (5M pixels or more) image sensors. This packaging technique has the back surface of the grinded, diced chip bonded to pad on PCB using bonding metal wire, mounts and lens with IR glass are installed to form assembly module structure. However, CSP packaging has the following significant issues: 1. it is very difficult to control micro dust, super high level clean room is needed and the cost of manufacture and maintenance is high; 2. product design is customized, cycle is long, and flexibility is insufficient; 3. large scale production is difficult.

CIS FC is a chip level packaging technique recently developed for high end, high resolution (5M pixels or more) image sensors. This packaging technique has the ground and cut chip pad with completed metal bumps on pad directly connected to the PCB pad by having all the contact bumps connected with the pad by thermo-ultrasonic effect to form a package structure. Module assembled structure is formed by pad or solder balls outside the PCB employing SMT method during back end. But FC packaging has the following significant issues: 1. this package requires PCB substrate to have thermal expansion coefficient close to Si, which is expensive; 2. it is difficult to manufacture reliably, the requirement of thermo-ultrasonic of all the bumps and the consistency of the connections to the pad are high, and the bumps and pad are hard-connected and extended poorly; 3. it is difficult to control micro dust, the demand on process environment is high and the cost is high.

In summary, it is in urgent need of a packaging technology with low cost, high performance, and high reliability to achieve an ultrathin package structure for high resolution, large scale image sensors.

SUMMARY

Based on the above considerations, it would be advantageous to propose a method that can package an ultrathin, high resolution image sensor in a very low cost and a corresponding sensor structure.

In accordance with an aspect of the present invention, there is provided a method of packaging an image sensor, including: providing an image sensor chip and a transparent package substrate, a front side of the image sensor chip comprising an image sensing region and a pad region surrounding the image sensing region; bonding a first end of a metal wire to the pad, the metal wire being suspended over the image sensor chip; and aligning and attaching the image sensor chip to the package substrate by an adhesive to form a package, a second end of the metal wire being suspended without being covered by the adhesive.

In accordance with an embodiment of the present invention, the suspended metal wire is electrically connectable to a printed circuit board (PCB), a flexible circuit board, or a ceramic circuit board by means of surface mount technology (SMT) or pressure welding.

In accordance with an embodiment of the present invention, the adhesive covers the pad region and a region surrounding the first end of the metal wire.

In accordance with an embodiment of the present invention, a package frame is provided to be aligned and attached by an adhesive to the package substrate and the image sensor chip.

In accordance with an embodiment of the present invention, a marker is fabricated on the package frame.

In accordance with an embodiment of the present invention, the package frame comprises an inner frame and an outer frame, a through gap region being arranged between the inner frame and the outer frame.

In accordance with an embodiment of the present invention, an adhesive material is filled through the gap region between the inner frame structure and the outer frame structure.

In accordance with an embodiment of the present invention, the package frame is positioned midway between the package substrate and the image sensor chip, the package frame isolating the image sensing region from the pad region.

In accordance with an embodiment of the present invention, the package frame has a second end adjacent to the package substrate, which protrudes from the package substrate in a vertical direction by more than 10 micrometers.

In accordance with an embodiment of the present invention, the package frame has a second end adjacent to the package substrate, and the inner surface of the second end is provided with a ventilation slot or a glue expansion slot.

In accordance with an embodiment of the present invention, the package frame has a third end adjacent to the image sensor chip, which protrudes from the pad surface of the image sensor chip in a vertical direction by more than 10 micrometers.

In accordance with an embodiment of the present invention, the package frame has a third end adjacent to the image sensor chip, which has a slope inclined to the inner surface of the frame structure, the position of the slope being corresponding to the gap region and the slope preventing the adhesive material from splitting over.

In accordance with an embodiment of the present invention, the metal wire is shaped by a shaping fixture.

In accordance with an embodiment of the present invention, the distance between the package substrate and the image sensor chip is greater than or equal to 40 micrometers.

In accordance with an embodiment of the present invention, four corners of the package frame corresponding to the package substrate and the image sensor chip have a protecting region, which reserves space between the package frame and the package substrate and between the package frame and the image sensor chip.

In accordance with an embodiment of the present invention, the adhesive material is filled by one or more of dispensing, painting, pouring, or screen printing.

In accordance with an embodiment of the present invention, the package substrate is of a glass material, a plastic material, or a sapphire material.

In accordance with an embodiment of the present invention, an infrared filter film or an optical anti-reflection film is coated on a single side of the package substrate, respectively; or an infrared filter film and an optical anti-reflection film are coated on both sides of the package substrate, respectively.

In accordance with an embodiment of the present invention, an adhesive material with variable stickiness when heated is formed on the back side of the image sensor chip to fix the package to the printed circuit board, the flexible circuit board, or the ceramic circuit board.

In accordance with an embodiment of the present invention, the adhesive material with variable stickiness is hot melt glue.

In accordance with an embodiment of the present invention, the metal wire is gold wire, copper wire, aluminum wire, silver wire, or alloy wire.

The present invention further provides an image sensor package, including: an image sensor chip, its front side being provided with an image sensing region and a pad region surrounding the image sensing region; a metal wire, suspended over the image sensor chip, its first end being electrically connected to the pad, and its second end being suspended over the package; a transparent package substrate, mounted on the image sensor; wherein the package further comprises an adhesive material positioned between the image sensor chip and the package substrate and covering the pad region and a region surrounding the first end of the metal wire.

In accordance with an embodiment of the present invention, a second end of the suspended metal wire is electrically connectable to a printed circuit board (PCB), a flexible circuit board, or a ceramic circuit board by means of surface mount technology (SMT) or pressure welding.

In accordance with an embodiment of the present invention, the package further comprises a package frame arranged between the image sensor chip and the package substrate.

In accordance with an embodiment of the present invention, a marker is disposed on the package frame.

In accordance with an embodiment of the present invention, the package frame further comprises: an inner frame and an outer frame, a through gap region being arranged between the inner frame and the outer frame.

In accordance with an embodiment of the present invention, the adhesive material is located within the gap region.

In accordance with an embodiment of the present invention, the package frame is positioned midway between the package substrate and the image sensor chip, the package frame isolating the image sensing region from the pad region.

In accordance with an embodiment of the present invention, the package frame has a second end adjacent to the image sensor chip, which protrudes from the package substrate in a vertical direction by more than 10 micrometers.

In accordance with an embodiment of the present invention, the package frame has a second end adjacent to the package substrate, and the inner surface of the second end is provided with a ventilation slot or a glue expansion slot.

In accordance with an embodiment of the present invention, the package frame has a third end adjacent to the image sensor chip, which protrudes from the pad surface of the image sensor chip in a vertical direction by more than 10 micrometers.

In accordance with an embodiment of the present invention, the package frame has a third end adjacent to the image sensor chip, which has a slope inclined to the inner surface of the frame structure, the position of the slope being corresponding to the gap region.

In accordance with an embodiment of the present invention, the vertical distance between the package substrate and the image sensor chip is greater than or equal to 40 micrometers.

In accordance with an embodiment of the present invention, four corners of the package frame respectively corresponding to the package substrate and the image sensor chip have a protecting region, which reserves space between the package frame and the package substrate and between the package frame and the image sensor chip.

In accordance with an embodiment of the present invention, the package substrate is of a glass material, a plastic material, or a sapphire material.

In accordance with an embodiment of the present invention, an infrared filter film or an optical anti-reflection film is coated on one side of the package substrate, respectively or an infrared filter film and an optical anti-reflection film are coated on both sides of the package substrate, respectively.

In accordance with an embodiment of the present invention, an adhesive material with variable stickiness is disposed on the back side of the image sensor chip to fix the package to the printed circuit board, the flexible circuit board, or the ceramic circuit board.

In accordance with an embodiment of the present invention, the metal wire is gold wire, copper wire, aluminum wire, silver wire, or alloy wire.

In accordance with an embodiment of the present invention, four corners of the package frame corresponding to the package substrate and the image sensor chip have a protecting region, which reserves space between the package frame and the package substrate and between the package frame and the image sensor chip.

In the present invention, the packaging is performed by bonding the metal wire connections and operating equipment integrating flip-chip, bonding, dispensing, and UV curing with the package substrate after cutting the image sensor chips, and thus the high reliability and large scale productivity are achieved.

The process of the invention is simple. The chip is directly mounted onto the glass substrate after being bonded and is UV cured immediately, thus eliminating the conventional cleaning, baking, inspecting processes, which require a high clean environment.

In this invention, IR/AR films can be coated on a glass substrate and/or on its surface, and the distance from the photosensitive surface of the chip is controllable, which may exhibit the optical performance of the lens than conventional COB having minimal distance limitation, and thus lens can be selected over a wider range.

In this invention, SMT process is exploited to assemble during back end process, because the SMT process exploits SMT connection of PCB pad, bonding metal element wire and soldering, it is advantageous over SMT connection of conventional CSP pad, BGA and soldering.

The back side of silicon chip of present invention is silicon with thermal conducting adhesive, and thus its thermal conductivity is superior. The glass substrate and chip of the present invention act as an inlaid structure without supporting loads, and thus its thickness can be controlled and overall ultrathin package structure can be achieved. Gold wire has good malleability, good adaptability to environment and good reliability, thus gold wire is used to connect the chip and pad on PCB substrate in this invention. By attachment of controllable adhesive material (glue), the invention can control the pressure in the cavity of the package structure by heating and/or sealing level to improve reliability. The frame structure of the invention provides functions of structure strength supports, inlaid supports, anti-glue split over, alignment and marking. The process of the present invention is simplified, the requirement on clean environment control is significantly decreased and the highly costive bonding PCB substrate is saved. As a result, the package cost is low.

Various aspects of the present invention will be more apparent by illustrating the detailed embodiments below.

BRIEF DESCRIPTION OF THE DRAWINGS

Other features, objects, and advantages of present invention will be more apparent form the following detailed description of the non-limiting embodiments when read with reference to the accompanying figures, in which.

In the figures, identical or similar reference numerals indicate identical or similar devices (modules) or steps throughout the drawings.

DETAILED DESCRIPTION

In the detailed description of the following preferred embodiments, reference is made to the accompanying figures that constitute a part of present invention. The accompanying figures illustrate specific embodiments that can implement the present invention by way of example. It is to be understood that other embodiments may be employed and structural or logical modifications can be made without departing from the scope of present invention. Accordingly, the following detailed description is non-limiting and the scope of present invention is defined by the appended claims.

To more clearly illustrate the packaging method of present invention, glass is used as the substrate in the following embodiments. It is to be understood by those skilled in the art that the substrate may be made from other transparent materials.

Figure 1:
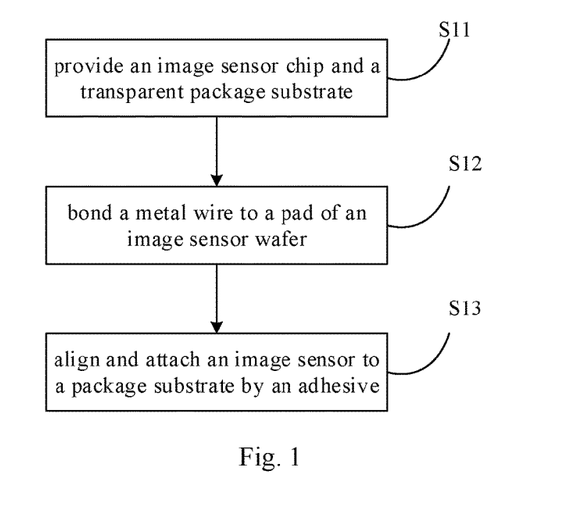
FIG. 1 is a flow chart of a packaging method of an image sensor in accordance with an embodiment of the invention.

FIG. 1 is a flow chart of a packaging method of an image sensor in accordance with an embodiment of present invention.

As shown in FIG. 1, the packaging method comprises the following steps.

Firstly, step S11 is performed, in which an image sensor chip 207 and a transparent package substrate 201 are provided.

In this step, the front side of the image sensor chip 207 is provided with an image sensing region 206 and a pad region 205 surrounding the image sensing region 206.

Preferably, the package substrate and the image sensor chip correspond to each other, which means the package substrate is formed by cutting one larger substrate. In an embodiment, a single image sensor chip 207 is formed by mechanically cutting or laser cutting a wafer with several image sensor chips 207, and a single package substrate 201 matching a single image sensor chip 207 in size is formed by cutting a wafer level package substrate.

Secondly, step S12 is performed, in which a metal wire is bonded to a pad of the image sensor chip.

In this step, the first end 204a of the metal wire 204 is bonded to the pad such that other parts of metal wire 204 than the first end 204a may be suspended. In this embodiment, the metal wire that does not contact the surface of the image sensor chip 207 is formed and the second end 204b extends and suspends out of image sensor chip 207. It is to be understood that the metal wire may be good conductor wire such as gold wire, copper wire, aluminum wire, silver wire, or alloy wire. Optionally, a shaping fixture may be employed by metal wire to shape metal wire 204.

Then, step S13 is performed, in which the image sensor chip is aligned and attached to the package substrate by an adhesive.

In this step, the image sensor chip are aligned and attached to the package substrate by an adhesive to form one package. The second end 204b of the metal wire is suspended and positioned outside the adhesion part, that is, the metal wire is not covered by adhesive (glue). In an embodiment, the package substrate 201 is controlled to keep a distance from the image sensor chip 207. The metal wire 204 does not contact the package substrate 201. The adhesive material is filled between the package substrate 201 and the image sensor chip 207 by dispensing, pouring, painting, screen printing, or combination thereof. The adhesive covers the pad region 205 and the first end 204a of the metal wire but not the image sensing region 206 and the second end 204b of the metal wire. The second end 204b of the metal wire is further bonded onto an external printed circuit board, flexible circuit board, or ceramic circuit board.

Now reference is made to FIGS. 2c-2i.

Figure 2A:
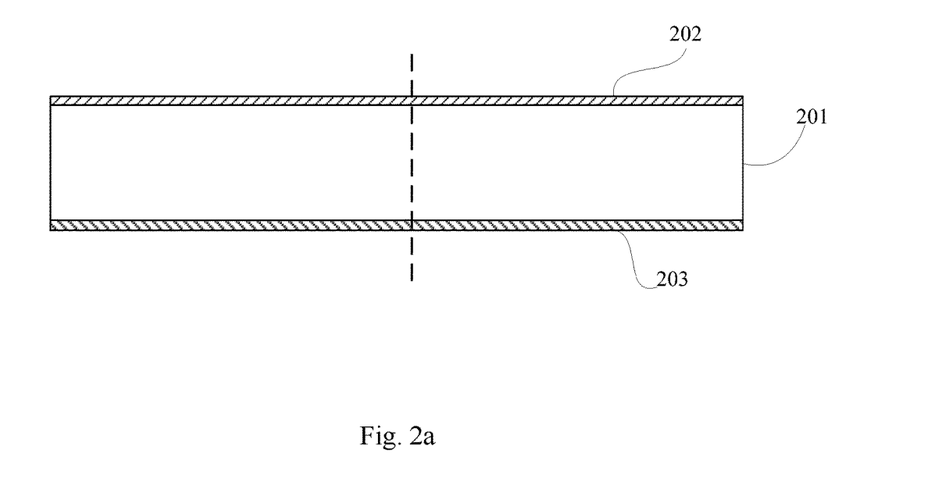
FIG. 2a is a schematic diagram of a package substrate in accordance with an embodiment of the invention.
Figure 2B:
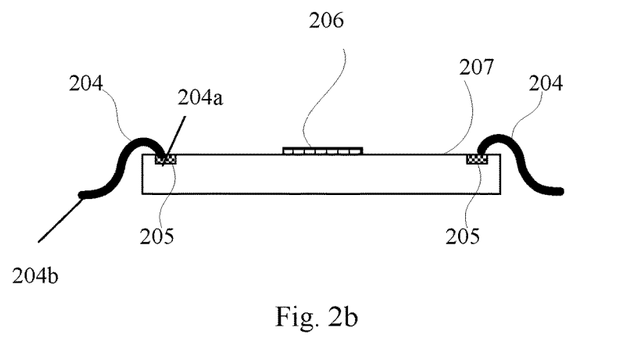
FIG. 2b is a schematic diagram of an image sensor chip and a bonding metal wire in accordance with an embodiment of the invention.
Figure 2C:
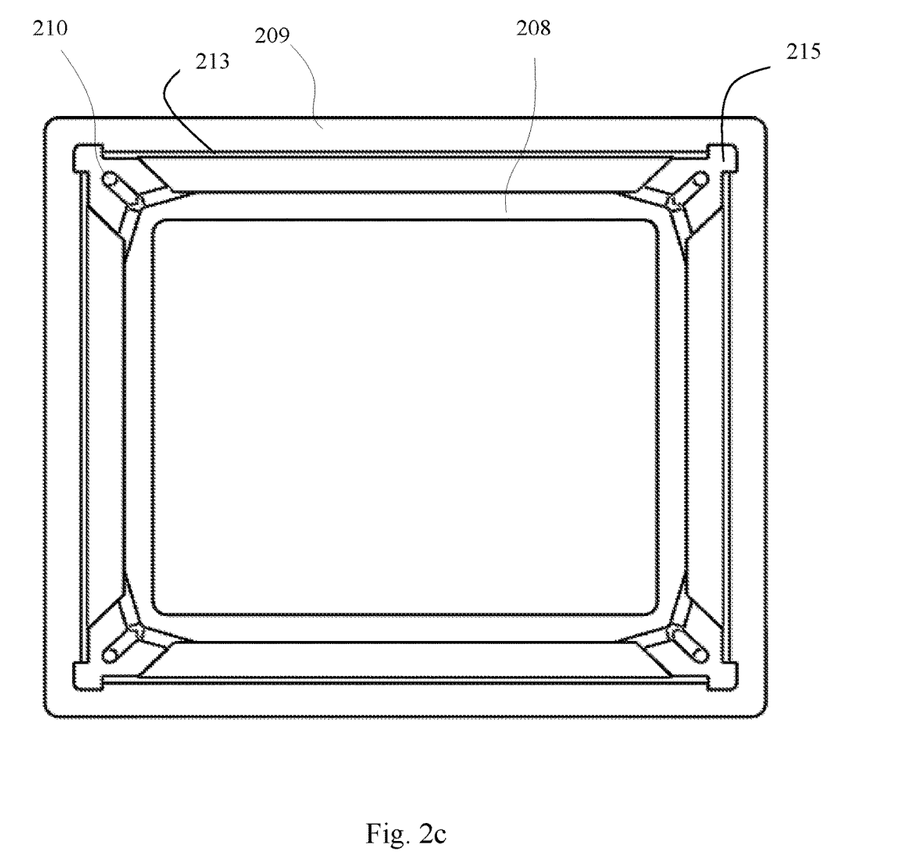
FIG. 2c is a top view of a package frame in accordance with an embodiment of the invention.
Figure 2D:
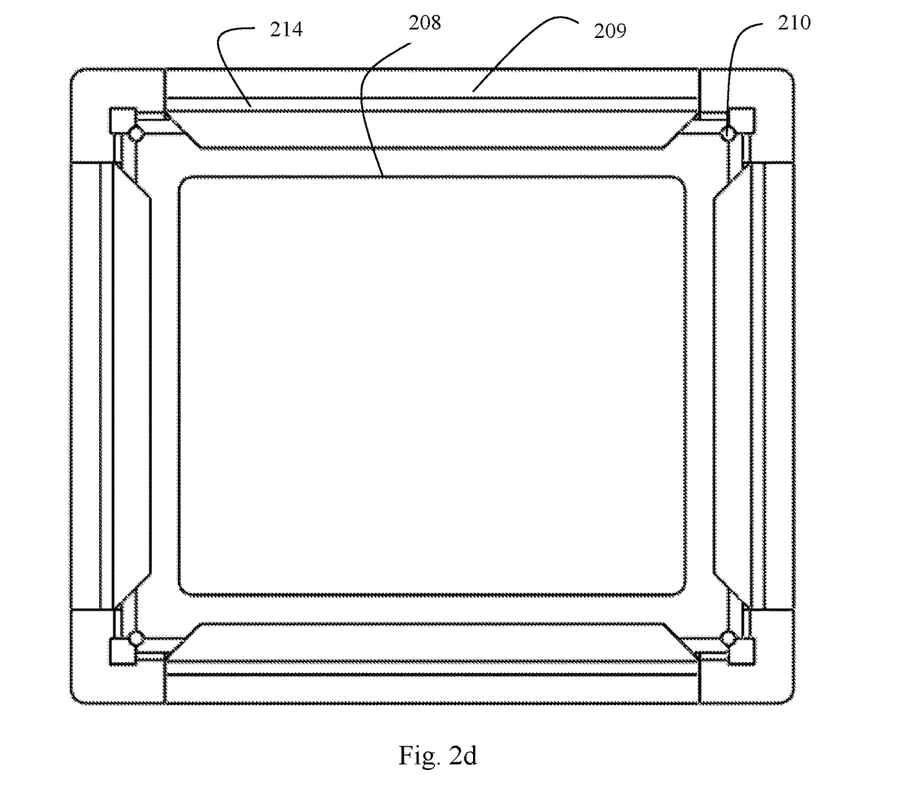
FIG. 2d is a bottom view of a package frame in accordance with an embodiment of the invention.
Figure 2E:
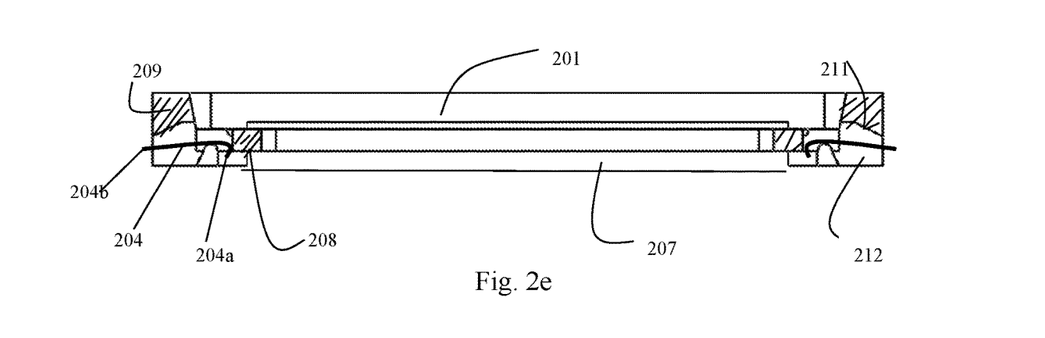
FIG. 2e is a cross sectional view of a package including an image sensor chip, a package substrate, and a package frame in accordance with an embodiment of the invention.
Figure 2F:
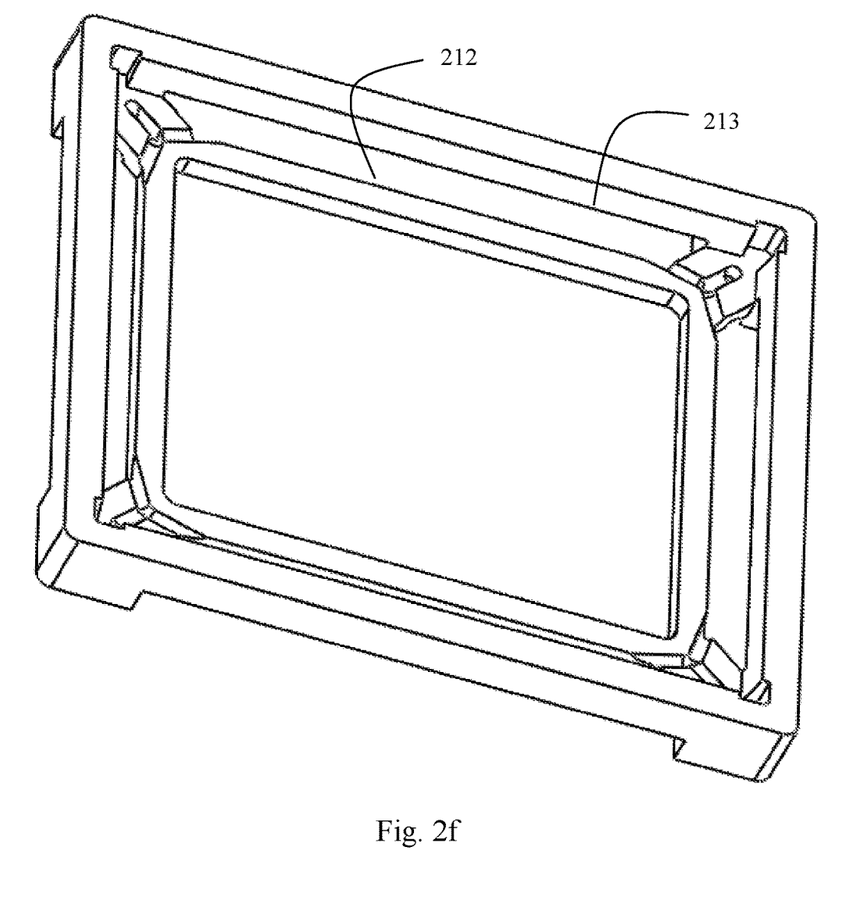
FIG. 2f is a perspective view of a package frame in accordance with an embodiment of the invention.
Figure 2G:
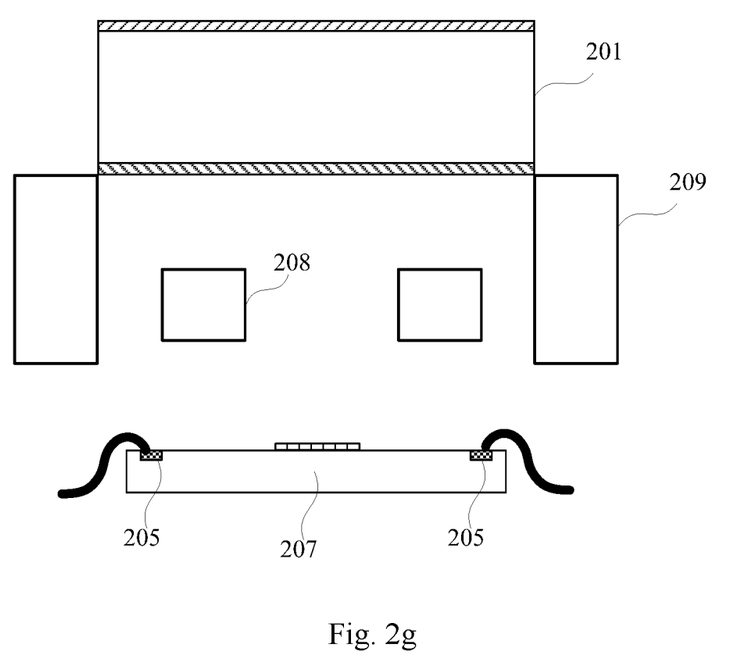
FIGS. 2g-2i are cross-sectional schematic diagrams of an embodiment of the present invention in accordance with the method of FIG. 1.
Figure 2H:
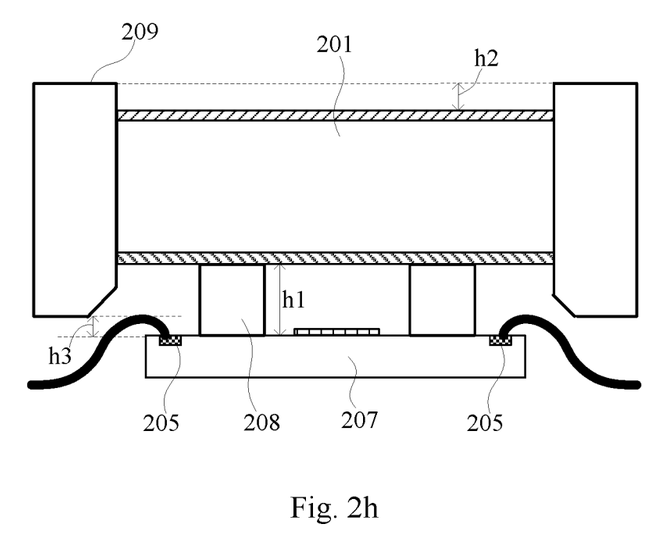
Figure 2I:
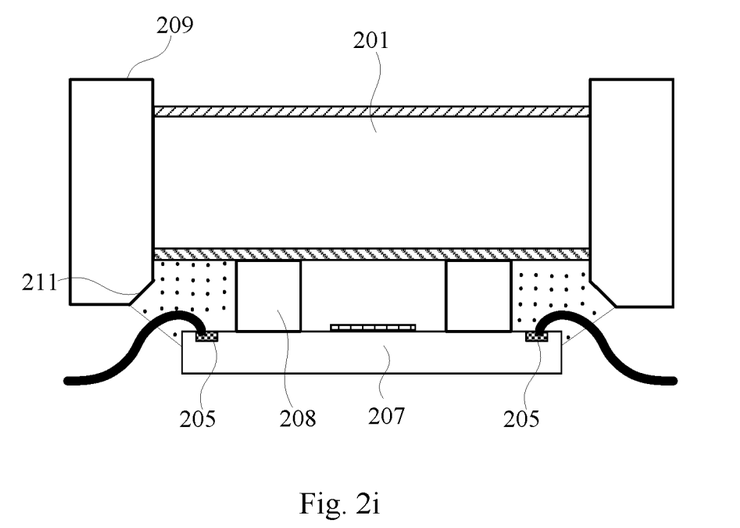

FIG. 2c is a top view of an package frame in accordance with an embodiment of the invention; FIG. 2d is a bottom view of a package frame in accordance with an embodiment of the invention; FIG. 2e is a cross sectional view of a package including an image sensor chip, a package substrate, and a package frame in accordance with an embodiment of the invention; FIG. 2f is a perspective view of a package frame in accordance with an embodiment of the invention; FIGS. 2g-2i are cross-sectional schematic diagrams of an embodiment of the present invention in accordance with the method of FIG. 1. In the following, the packaging method for the image sensor is further illustrated in connection with FIGS. 2c-2i and with FIGS. 2a and 2b.

In FIG. 2a, a package substrate 201 of a transparent material is provided, and an infrared filter (IR) film 202 is formed on top of the package substrate 201 and an optical anti-reflection (AR) film 203 is formed on bottom of the package substrate 201, or the IR film is formed on top of the package substrate 201 and the AR film is formed on bottom of the package substrate 201, so as to enhance the optical transmittance of the package substrate 201 (the main function of the AR film) and prevent interference from IR light (the main function of the IR film). In some examples, only the IR film 202 is formed on the package substrate 201 without forming the AR film 203 or only the AR film is formed without forming the IR film or the IR and AR films are formed on the same side, depending on the requirement of application. Optionally, vacuum evaporation, chemical vapor deposition, sol, and so on may be employed to form the above two films on the substrate. The package substrate 201 is then cut and each part of the cut package substrate 201 corresponds to one image sensor chip to be subsequently packaged.

It is to be understood that package substrate 201 may be of a transparent material such as glass, plastics or sapphire. Moreover, an IR filter film or optical anti-reflection film may be coated on a single side of the package substrate 201, or both the IR filter film and the optical anti-reflection film may be coated on both sides of the package substrate 201, respectively.

Then, as shown in FIG. 2b, after thinning the image sensor chip from the backside thereof, the image sensor chip is cut apart to obtain individual image sensor chips 207 in the figure, in which the image sensing region is positioned between two pads 205. Optionally, mechanical cutting or laser cutting may be employed to cut the image sensor chip 207. Moreover, the first end of the metal wire 204 is bonded onto the pad 205 to form an "arc" shape bonding. It is to be understood that the metal wire 204 may be of an electrically conductive robust material such as gold, copper, aluminum, silver, or alloy. Preferably, the metal wire of the image sensor chip 207 is bonded into the pad 205.

In some embodiments, the metal wire may be ring-shaped, that is, its head end and tail end are each bonded to the pad of the image sensor chip 207, and the middle part of the metal wire suspends and extends out of image sensor chip 207 and is bonded onto an external printed circuit board, flexible circuit board, or ceramic circuit board.

Referring to FIGS. 2c-2i, in an embodiment, a package frame is employed in the process of packaging.

The package frame comprises an inner frame 208 and an outer frame 209. When the frame is flat bonded to the image sensor chip 207, the inner frame 208 will be used to prevent external material from entering the inner frame, and the outer frame 209 will be used to support, for example, the transparent substrate 201. A ventilation slot or glue expansion slot 210 is arranged inside the outer frame 209 and implemented by opening slot or holes at four corners of the inner frame 208 structure, such that it functions to adjust the internal component pressure and flow glue.

Optionally, the package frame can be marked, for example, on the inner frame 208 and outer frame 209 to provide distinguishable markers for the image sensor without affecting the semiconductor chip or transparent substrate.

The image sensor chip is positioned between the image sensing region 206 and the pad 205 to isolate the adhesive material. The outer frame 209 is located on both sides of the image sensor chip 207.

Then, the image sensor chip 207, the package substrate 201, and the package frame are bonded. During bonding, the previous "arc-shaped" metal wire will be further bent due to the force applied by the outer frame 209.

FIGS. 2e and 2h are bonded image sensors in accordance with embodiments of present invention.

After being bonded, the distance h1 between the package substrate 201 and the image sensor chip 207 is greater than or equal to 40 μm. Preferably, the package frame has a second end adjacent to the package substrate, which protrudes from the package substrate along the vertical direction by a distance h2 greater than or equal to 10 μm. Preferably, the package frame has a third end adjacent to image sensor chip 207, which protrudes from the pad surface of the image sensor chip along the vertical direction by a distance greater than or equal to 10 μm, i.e., the bottommost area of the third end is higher than the image sensor chip surface vertically by a distance h3 greater than or equal to 10 μm, and cooperates with a slope to facilitate injection of adhesive materials.

FIG. 2i is the image sensor after glue-injecting according to embodiments of the present invention, and reference is made to FIGS. 2c~2f at the same time.

The adhesive material is injected into the space 212 enclosed by the inner surface of the outer frame 209, the package substrate 201, and the inner frame 208. After the glue-injecting is completed, the glue and the image sensing region can be isolated by the inner frame 208. The adhesive portion covers the pad region and the surrounding region of the first end of the metal wire.

Preferably, a through gap region 212 is arranged between the inner frame 208 and the outer frame 209, and the adhesive material is filled through the gap region.

Preferably, the third end of the package frame adjacent to the image sensor chip has a slope 211 inclined to the inner surface of the outer frame 209. The position of the slope 211 is corresponding to the above gap region. The whole package is reversely placed during the injection of the adhesive material as shown in FIG. 2e, i.e., the image sensor chip 207 is on the top and the package substrate 201 is on the bottom. The slope 211 facilitates the injection of adhesive material into the package during the glue-injecting.

Then reference is made to FIGS. 2c, 2d and 2f.

The four corners of the package frame corresponding to the package substrate 201 and the image sensor chip 207 have a protecting region 215, which reserves space between the package frame and the package substrate 201 and between the package frame and the image sensor chip 207 so that certain degree of displacement or sway of the package substrate 201 and the image sensor chip 207 may be allowed without causing any damage to the device. Preferably, a slope 214 is provided between one side of the inner frame 208 and the image sensor chip 207 to facilitate the match between the image sensor chip 207 and the inner frame 208 while a slope 213 is provided between another side of the inner frame 208 and the package substrate 201 to facilitate the match between the package substrate 201 and the inner frame 208.

It is to be understood that the adhesive material may be filled by one or more of dispensing, painting, pouring, or screen printing during the glue injection.

Preferably, an adhesive material with variable stickiness may be disposed on the back side of the image sensor chip 207 to fix and adjust the package to the printed circuit board, the flexible circuit board, or the ceramic circuit board. Hot melt glue may be employed. The stickiness of the adhesive material may be changed by changing temperature, the melting point of the hot melt glue used is lower than SMT, and the position of the image sensor chip 207 relative to printed circuit board, the flexible circuit board, or the ceramic circuit board may be adjusted once again after the chip was initially attached.

In the invention, there is also provided an image sensor package, which comprises:

an image sensor chip 207, the front side of which includes an image sensing region 206 and a pad 205 region surrounding the image sensing region 206;

a metal wire 204, suspended over the image sensor chip 206, its first end being electrically connected to the pad 205, and its second end being suspended;

a transparent package substrate, built on the image sensor 207;

an adhesive material, positioned between the image sensor chip 207 and the package substrate 201 and covering the pad 205 region and the surrounding region of the first end of the metal wire 204.

Preferably, the package substrate 201 is of a transparent material such as glass, plastics, or sapphire. One side of the package substrate 201 is covered by an infrared filter film or optical anti-reflection film, or both sides of the package substrate 201 are covered by an infrared filter film and an optical anti-reflection film, respectively.

Preferably, the package also comprises a package frame positioned between an image sensor chip 207 and the package substrate. The package frame comprises an inner frame 208 and an outer frame 209, and a through gap region is disposed between the inner frame 208 and the outer frame 209. The adhesive material is located in the gap region.

Preferably, the package frame is positioned between the package substrate 201 and the image sensor chip 207 and isolates the image sensing region 206 from the pad 205 region. The package frame has a second end adjacent to package substrate 201, which protrudes from the package substrate along the vertical direction by more than 10 μm. The package frame has a second end adjacent to package substrate 201, and a ventilation slot or glue expansion slot is arranged in the inner surface of the second end.

Preferably, the package frame has a third end adjacent to image sensor chip 207, which protrudes from the pad surface of image sensor chip 207 along the vertical direction by more than 10 μm.

Preferably, the package frame has a third end adjacent to image sensor chip 207, which has a slope inclined to the inner surface of the outer frame 209, the position of the slope being corresponding to the gap region.

Preferably, the vertical distance between the package substrate and the image sensor chip 207 is greater than or equal to 40 μm. The four corners of the package frame corresponding to the package substrate 201 and the image sensor chip 207 respectively have a protecting region, which reserves space between the package frame and the package substrate 201 and between the package frame and the image sensor chip 207 to provide protection.

Preferably, an adhesive material with variable stickiness when heated is disposed on the back side of the image sensor chip 207 for fixing the package to the printed circuit board, the flexible circuit board, or the ceramic circuit board.

The suspended metal wire may be electrically connected to a printed circuit board, a flexible circuit board, or a ceramic circuit board by means of SMT or pressure welding without the need of solder balls by employing an image sensor formed by present invention, and thus processing steps and manufacturing cost are reduced. Further, conducting performance may be even better due to the connection of metal wire and circuit board without solder balls. The packaging is performed by bonding the metal wire connections and operating equipment integrating flip-chip, bonding, dispensing, and UV curing with the package substrate after cutting the image sensor chips, and thus the high reliability and large scale productivity are achieved. The process is simple. The chip is directly mounted onto the glass substrate after being bonded and is UV cured immediately, thus eliminating the conventional cleaning, baking, inspecting processes, which require a high clean environment. IR/AR films can be coated on a glass substrate and/or on its surface, and the distance from the photosensitive surface of the chip is controllable, which may exhibit the optical performance of the lens than conventional COB having minimal distance limitation, and thus lens can be selected over a wider range. SMT process is exploited to assemble during back end process, because the SMT process exploits SMT connection of PCB pad, bonding metal element wire and soldering, it is advantageous over SMT connection of conventional CSP pad, BGA and soldering. The back side of silicon chip of present invention is silicon with thermal conducting adhesive, and thus its thermal conductivity is superior. The glass substrate and chip of the present invention act as an inlaid structure without supporting loads, and thus its thickness can be controlled and overall ultrathin package structure can be achieved. Gold wire has good malleability, good adaptability to environment and good reliability, thus gold wire is used to connect the chip and pad on PCB substrate in this invention. By attachment of controllable adhesive material (glue), the invention can control the pressure in the cavity of the package structure by heating and/or sealing level to improve reliability. The frame structure of the invention provides functions of structure strength supports, inlaid supports, anti-glue split over, alignment and marking. The process of the present invention is simplified, the requirement on clean environment control is significantly decreased and the highly costive bonding PCB substrate is saved. As a result, the package cost is low.

It is apparent to a person skilled in the art that the present invention is not limited to details of above exemplary embodiments, and the present invention may be implemented in other specific forms without departing from the spirit and basic feature of the present invention. Thus, embodiments should be considered as illustrating rather than limiting in any way. Further, apparently, the word "include" or "comprise" does not preclude other elements and steps, and the term "a" or "an" does not preclude the plurality. Multiple elements described in product claims may be implemented by one element. The words "first" and "second" are used to denote designations rather than to denote any specific order.

We claim:

1. An image sensor package, characterized in that, including:

an image sensor chip, its front side being provided with an image sensing region and a pad region surrounding the image sensing region;

a metal wire, suspended over the image sensor chip, its first end being electrically connected to the pad, and its second end being suspended over the package;

a transparent package substrate, adhered with the image sensor chip;

wherein the package further comprises an adhesive material filled between the image sensor chip and the package substrate and covering the pad region and a region surrounding the first end of the metal wire and not covering the image sensing region and the second end of the metal wire.

2. The image sensor package of claim 1, characterized in that, a second end of the suspended metal wire is electrically connectable to a printed circuit board (PCB), a flexible circuit board, or a ceramic circuit board by means of surface mount technology (SMT) or pressure welding.

3. The image sensor package of claim 1, characterized in that, the package further comprises a package frame arranged between the image sensor chip and the package substrate.

4. The image sensor package of claim 3, characterized in that, a marker is disposed on the package frame.

5. The image sensor package of claim 3, characterized in that, the package frame further comprises: an inner frame and an outer frame, a through gap region being arranged between the inner frame and the outer frame.

6. The image sensor package of claim 5, characterized in that, the adhesive material is located within the gap region.

7. The image sensor package of claim 3, characterized in that, the package frame is positioned midway between the package substrate and the image sensor chip, the package frame isolating the image sensing region from the pad region.

8. The image sensor package of claim 3, characterized in that, the package frame has a second end adjacent to the image sensor chip, which protrudes from the package substrate in a vertical direction by more than 10 micrometers.

9. The image sensor package of claim 3, characterized in that, the package frame has a second end adjacent to the package substrate, and the inner surface of the second end is provided with a ventilation slot or a glue expansion slot.

10. The image sensor package of claim 3, characterized in that, the package frame has a third end adjacent to the image sensor chip, which protrudes from the pad surface of the image sensor chip in a vertical direction by more than 10 micrometers.

11. The image sensor package of claim 5, characterized in that, the package frame has a third end adjacent to the image sensor chip, which has a slope inclined to the inner surface of the frame structure, the position of the slope being corresponding to the gap region.

12. The image sensor package of claim 3, characterized in that, the vertical distance between the package substrate and the image sensor chip is greater than or equal to 40 micrometers.

13. The image sensor package of claim 1, characterized in that, the package substrate is of a glass material, a plastic material, or a sapphire material.

14. The image sensor package of claim 1, characterized in that, an infrared filter film or an optical anti-reflection film is coated on one side of the package substrate, respectively or an infrared filter film and an optical anti-reflection film are coated on both sides of the package substrate, respectively.

15. The image sensor package of claim 1, characterized in that, an adhesive material with variable stickiness is disposed on the back side of the image sensor chip to fix the package to the printed circuit board, the flexible circuit board, or the ceramic circuit board.

16. The image sensor package of claim 15, characterized in that, the adhesive material with variable stickiness is hot melt glue.

17. The image sensor package of claim 1, characterized in that, the metal wire is gold wire, copper wire, aluminum wire, silver wire, or alloy wire.

18. The image sensor package of claim 3, characterized in that, four corners of the package frame corresponding to the package substrate and the image sensor chip have a protecting region, which reserves space between the package frame and the package substrate and between the package frame and the image sensor chip.

* * * * *